(12) United States Patent
Itagaki et al.

(10) Patent No.: US 8,263,313 B2
(45) Date of Patent: Sep. 11, 2012

(54) PHOTOSENSITIVE RESIN COMPOSITION AND PHOTOSENSITIVE FILM MADE WITH THE SAME

(75) Inventors: Katsutoshi Itagaki, Hitachi (JP); Naoki Sasahara, Hitachi (JP); Takuji Abe, Hitachi (JP); Yoshiki Ajioka, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 912 days.

(21) Appl. No.: 11/573,405

(22) PCT Filed: Aug. 11, 2005

(86) PCT No.: PCT/JP2005/014772
§ 371 (c)(1),
(2), (4) Date: Jul. 16, 2009

(87) PCT Pub. No.: WO2006/016658
PCT Pub. Date: Feb. 16, 2006

(65) Prior Publication Data
US 2009/0297981 A1    Dec. 3, 2009

(30) Foreign Application Priority Data

Aug. 11, 2004 (JP) ................ P2004-234816

(51) Int. Cl.
*G03F 7/20* (2006.01)
*G03F 7/032* (2006.01)

(52) U.S. Cl. ........... 430/281.1; 430/277.1; 430/288.1; 430/285.1; 430/954; 430/271.1; 430/275.1

(58) Field of Classification Search .............. None
See application file for complete search history.

(56) References Cited

U.S. PATENT DOCUMENTS

| 4,268,610 | A | * | 5/1981 | Roos .................. 430/281.1 |
| 4,680,249 | A | | 7/1987 | Weed |
| 4,980,266 | A | * | 12/1990 | Kawaguchi et al. ...... 430/281.1 |

FOREIGN PATENT DOCUMENTS

| JP | 50-009177 | 1/1975 |
| JP | 51-005934 | 1/1976 |
| JP | 10-123714 | 5/1998 |
| JP | 11-152401 | 6/1999 |
| JP | 11-160880 | 6/1999 |
| JP | 11-267407 | 10/1999 |

OTHER PUBLICATIONS

English translation of JP,11-160880, A (1999) from machine translation from AIPN Japan Patent Office National Center for Industrial Property Information and Training, generated Sep. 1, 2011, 11 pages.*
English translation of JP, 10-123714, A (1998) from machine translation from AIPN Japan Patent Office National Center for Industrial Property Information and Training, generated Dec. 1, 2011, 11 pages.*
Translation of the International Preliminary Report on Patentability, mailed Mar. 1, 2007, for International Application No. PCT/JP2005/014772.
Japanese Official Action issued Sep. 29, 2009, in Application No. 2006-531742.

* cited by examiner

*Primary Examiner* — Cynthia Hamilton
(74) *Attorney, Agent, or Firm* — Antonelli, Terry, Stout & Kraus, LLP.

(57) ABSTRACT

The invention provides a photosensitive resin composition that can form resists with excellent adhesiveness for conductive layers and that does not easily produce conductive layer discoloration, as well as a photosensitive film employing the composition. A preferred photosensitive film (1) according to the invention comprises a support (11), resin layer (12) and protective film (13), where the resin layer (12) is composed of a photosensitive resin composition comprising a binder polymer, a photopolymerizing compound, a photopolymerization initiator and a benzotriazole derivative represented by the following general formula (1).

[Chemical Formula 1]

(1)

[wherein $R^{11}$ and $R^{12}$ each independently represent hydrogen or a monovalent organic group, and $R^{13}$ represents a halogen atom, an alkyl, cycloalkyl, allyl, aryl, amino, alkylamino, nitro, cyano, mercapto, alkylmercapto, hydroxyl, hydroxyalkyl, carboxyl, carboxyalkyl, acyl or alkoxy group or a monovalent group with a heterocyclic ring, with the proviso that at least one of $R^{11}$ and $R^{12}$ is an optionally substituted aryl group or an organic group containing a C10 or greater hydrocarbon group.]

13 Claims, 1 Drawing Sheet

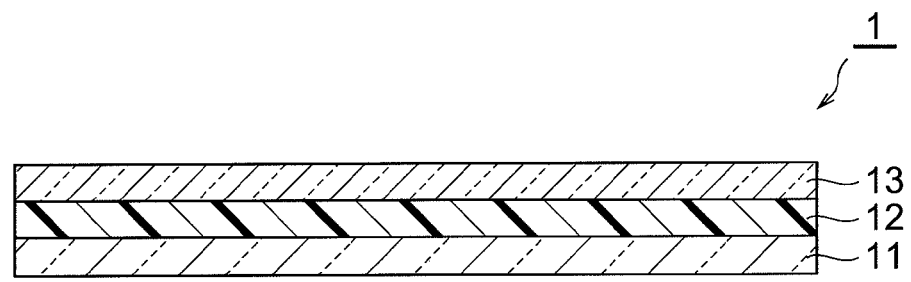

US 8,263,313 B2

PHOTOSENSITIVE RESIN COMPOSITION AND PHOTOSENSITIVE FILM MADE WITH THE SAME

TECHNICAL FIELD

The present invention relates to a photosensitive resin composition and to a photosensitive film employing it.

BACKGROUND ART

Photoresists (hereinafter referred to as "resists") are used in the manufacture of printed circuit boards. A resist is generally formed using a photosensitive film having a resin layer made of a photosensitive resin composition formed on a support base made of a resin film or the like. From the standpoint of reducing environmental burden and production cost, such photosensitive films have begun to be switched from organic solvent developing types to alkali developing types.

When a printed circuit board is manufactured with formation of the resist using a photosensitive film, the photosensitive film is laminated onto the conductive layer of a laminated board having a surface conductive layer made of copper or the like, with its resin layer in contact therewith, and thermocompression bonded. Next, the photosensitive film is exposed to light through a prescribed mask for curing of the exposed sections. A developing solution such as sodium carbonate is then used to remove the unexposed sections (uncured sections) to form a resist having the prescribed pattern. The resist is used as a mask for etching of the conductive layer or plating of the conductive layer, to form a circuit pattern. The resist is then removed using a sodium hydroxide or potassium hydroxide aqueous solution to obtain a printed circuit board.

In this type of printed circuit board manufacturing process, the resist must have excellent adhesiveness for the conductive layer in order to form a satisfactory circuit pattern. That is, if the resist has low adhesiveness for the conductive layer, the resist will tend to readily peel during the plating or etching step. For example, peeling of the resist during plating results in contact of the plating solution on undesired areas of the conductive layer. This causes the obtained circuit pattern to be thicker than the prescribed shape or produces disturbances in the form of the circuit pattern edges, making it difficult to form a satisfactory circuit pattern.

In order to avoid this inconvenience, methods are known for adding benzotriazole compounds to photosensitive resin compositions of resists as a means of improving the adhesiveness of the resists for conductive layers (for example, see Patent documents 1 to 3). These benzotriazole compounds have effects of improving adhesiveness of resin layers onto conductive layers.

[Patent document 1] Japanese Examined Patent Publication SHO No. 50-9177
[Patent document 2] Japanese Examined Patent Publication SHO No. 51-5934
[Patent document 3] U.S. Pat. No. 4,680,249

DISCLOSURE OF THE INVENTION

Problems to be Solved by the Invention

However, meticulous research by the present inventors has shown that it is difficult to achieve adequate adhesiveness when forming resists with fine pattern shapes (for example, narrow line widths) using the aforementioned conventional photosensitive resin compositions containing benzotriazole compounds, because of reduced contact area. When the amount of added benzotriazole compound is increased to improve the adhesiveness, conductive layers composed of metals or the like suffer discoloration, resulting in insufficient electrical characteristics of the circuit pattern. Discoloration of the conductive layer is believed to occur due to oxidation of the conductive layer surface. This conductive layer surface oxidation also tends to cause peeling of the resist during plating. Furthermore, peeling of the resist allows infiltration of plating solution between the resist and circuit pattern, which may also impair the electrical characteristics of the circuit pattern.

It is an object of the present invention, which has been accomplished in light of such circumstances, to provide a photosensitive resin composition that can form resists with sufficiently excellent adhesiveness for conductive layers and that does not easily produce conductive layer discoloration, as well as a photosensitive film employing the composition.

Means for Solving the Problems

In order to achieve the object stated above, the photosensitive resin composition of the invention is characterized by comprising a binder polymer, a photopolymerizing compound with an ethylenic unsaturated group, a photopolymerization initiator, and a benzotriazole derivative represented by the following general formula (1).

[Chemical Formula 1]

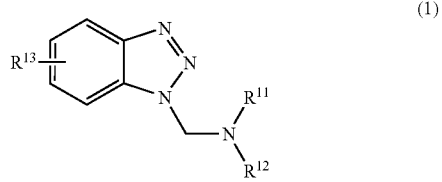

(1)

[wherein $R^{11}$ and $R^{12}$ each independently represent hydrogen or a monovalent organic group, and $R^{13}$ represents a halogen atom, an alkyl, cycloalkyl, allyl, aryl, amino, alkylamino, nitro, cyano, mercapto, alkylmercapto, hydroxyl, hydroxyalkyl, carboxyl, carboxyalkyl, acyl or alkoxy group or a monovalent group with a heterocyclic ring, with the proviso that at least one of $R^{11}$ and $R^{12}$ is an optionally substituted aryl group or an organic group containing a C10 or greater hydrocarbon group.]

Benzotriazole derivatives having the structure described above have a superior effect of improving adhesiveness of resists for conductive layers, as compared to conventional benzotriazole compounds. A photosensitive resin composition according to the invention comprising such a benzotriazole derivative can form a resist with sufficient adhesiveness for conductive layers even when forming fine patterns.

Moreover, since benzotriazole derivatives with such a structure have adequate adhesiveness-improving effects as described above, they can be added in smaller amounts than the prior art, and even when added in large amounts, for example, they produce extremely minimal discoloration of conductive layers made of metals and the like. The photosensitive resin composition of the invention can therefore vastly minimize the reduction in electrical characteristics caused by discoloration of conductive layers as explained above.

At least one of $R^{11}$ and $R^{12}$ in these benzotriazole derivatives is an optionally substituted aryl group or an organic group containing a C10 or greater hydrocarbon group. A photosensitive resin composition containing a benzotriazole derivative having such a structure exhibits excellent chemical resistance, and superior adhesiveness for conductive layers.

Preferably, at least one of $R^{11}$ and $R^{12}$ in the benzotriazole derivatives represented by general formula (1) above is alkyl, hydroxyalkyl or optionally substituted aryl. A benzotriazole derivative having such functional groups can exhibit further improved resist adhesiveness.

At least one of $R^{11}$ and $R^{12}$ may also be an organic group containing an imino group and a C10 or greater hydrocarbon group. The resist adhesiveness can also be improved by this type of benzotriazole derivative.

More specifically, an optionally substituted phenyl group is particularly preferred among alkyl, hydroxyalkyl or optionally substituted aryl groups. The organic group containing an imino group and a C10 or greater hydrocarbon group is more preferably a group represented by the following general formula (2).

[Chemical Formula 2]

(2)

[wherein $R^{21}$ represents C1-5 alkylene and $R^{22}$ represents a C10-30 monovalent hydrocarbon group.]

Also, $R^{13}$ is more preferably carboxyl. A benzotriazole derivative having such functional groups can exhibit further improved resist adhesiveness for conductive layers.

The photosensitive resin composition of the invention is preferably one also containing another benzotriazole. More preferably it is one further containing benzothiazole and/or its derivative. A photosensitive resin composition containing such compounds will exhibit more excellent resolution for light exposure. This will further facilitate satisfactory formation of resists with fine patterns.

The invention further provides a photosensitive film comprising a support and a resin layer made of a photosensitive resin composition of the invention as described above formed on the support. Since the resin layer of this type of photosensitive film is composed of a photosensitive resin composition of the invention, the resist obtained using it exhibits excellent adhesiveness for conductive layers even in the case of fine patterns, and inconveniences such as discoloration of metal foils of conductive layers occur very rarely. Moreover, using such a photosensitive film allows satisfactory manufacture of printed circuit boards with fine circuit patterns.

Effect of the Invention

According to the present invention, it is possible to provide a photosensitive resin composition that can form resists with sufficiently excellent adhesiveness for conductive layers and that does not easily produce conductive layer discoloration, as well as a photosensitive film employing the composition.

BRIEF EXPLANATION OF THE DRAWINGS

FIG. 1 is a schematic cross-sectional view showing an embodiment of a photosensitive film.

EXPLANATION OF SYMBOLS

1: Photosensitive film, 11: support, 12: resin layer, 13: protective film.

BEST MODE FOR CARRYING OUT THE INVENTION

Preferred embodiments of the invention will now be described in detail.

The photosensitive resin composition of the invention comprises (A) a binder polymer, (B) a photopolymerizing compound with an ethylenic unsaturated group, (C) a photopolymerization initiator and (D) a benzotriazole derivative represented by general formula (1) above.

(Benzotriazole Derivative Represented by General Formula (1))

The compounds represented by general formula (1) above as component (D) function as adhesion promoters in the photosensitive resin composition. In such compounds at least one of $R^{11}$ and $R^{12}$ is an optionally substituted aryl group or an organic group containing a C10 or greater hydrocarbon group. Of these, the groups represented by $R^{11}$ and $R^{12}$ are preferably each at least one from among alkyl, hydroxyalkyl and optionally substituted aryl groups, and organic groups containing imino and C10 or greater hydrocarbon groups, respectively. As such benzotriazole derivatives there are more preferred those wherein at least one of $R^{11}$ and $R^{12}$ is not an alkyl group or hydroxyalkyl group.

As hydroxyalkyl groups there are preferred C1-20 hydroxyalkyl groups, and specifically there may be mentioned 2-hydroxyethyl. As substituents for the optionally substituted aryl group there may be mentioned alkoxy, hydroxyl, amino, dialkylamino, methyl, ethyl, propyl, isopropyl, carboxyl, carboxyalkyl, acyl, cyano, mercapto, nitro and the like, among which alkoxy groups are preferred. Particularly preferred as an aryl group is phenyl optionally having such substituents. C1-20 alkyl groups are preferred as functional groups of groups other than the optionally substituted aryl group or the organic group containing a C10 or greater alkyl group, and specifically there may be mentioned propyl, isopropyl, 2-ethylhexyl, 3-tetradecyl, 3-pentadecyl, 3-hexyldecyl, 3-heptadecyl, 3-octadecyl and the like.

As organic groups containing an imino group and a C10 or greater hydrocarbon group there are preferred groups represented by general formula (2) above. In such groups, $R^{21}$ is preferably C1-5 alkylene, more preferably C1-3 alkylene and most preferably propylene. Also, $R^{22}$ is preferably a C10-30 monovalent hydrocarbon group, more preferably a C12-27 monovalent hydrocarbon group and most preferably a C14-24 monovalent hydrocarbon group. As hydrocarbon groups there may be mentioned saturated hydrocarbon groups and unsaturated hydrocarbon groups having one or more carbon-carbon double bonds.

In the group represented by $R^{13}$, chloro, fluoro, bromo and iodo are preferred as halogen atoms, C1-20 alkyl groups are preferred as alkyl, C3-10 alkyl groups are preferred as cycloalkyl, C6-14 aryl groups are preferred as aryl, C1-20 mono- or dialkylamino groups are preferred as alkylamino, C1-10 alkylmercapto groups are preferred as alkylmercapto, C1-20 hydroxyalkyl groups are preferred as hydroxyalkyl, carboxyalkyl groups with C1-10 alkyl groups are preferred as carboxyalkyl, acyl groups with C1-10 alkyl groups are preferred as acyl, C1-20 alkoxy groups are preferred as alkoxy, and monovalent groups derived from triazole, thiazole, tetrazole, oxazole and the like are preferred as monovalent groups with heterocyclic rings. Preferred among these as $R^{13}$ are carboxyl, methoxy, methyl, ethyl and ethoxy, with carboxyl being particularly preferred.

As benzotriazole derivatives represented by general formula (1) above there are preferred, specifically, 1-(N,N-diphenyl)aminomethylbenzotriazole-5-carboxylic acid represented by the following general formula (3a), 1-[N-(2-ethylhexyl)-N-(4-methoxyphenyl)]aminomethylbenzotriazole-5-carboxylic acid represented by the following general formula (3b), 1-[(3-tetradecylamino-propylamino)-methyl]-1H-benzotriazole-5-carboxylic acid represented by the following general formula (3c), 1-[(3-hexadecylamino-propylamino)-methyl]-1H-benzotriazole-5-carboxylic acid represented by the following general formula (3d), 1-[(3-octadecylamino-propylamino)-methyl]-1H-benzotriazole-5-carboxylic acid represented by the following general formula (3e), and 1-[(3-octadec-en-yl-amino-propylamino)-methyl]-1H-benzotriazole-5-carboxylic acid represented by the following general formula (3f).

[Chemical Formula 3]

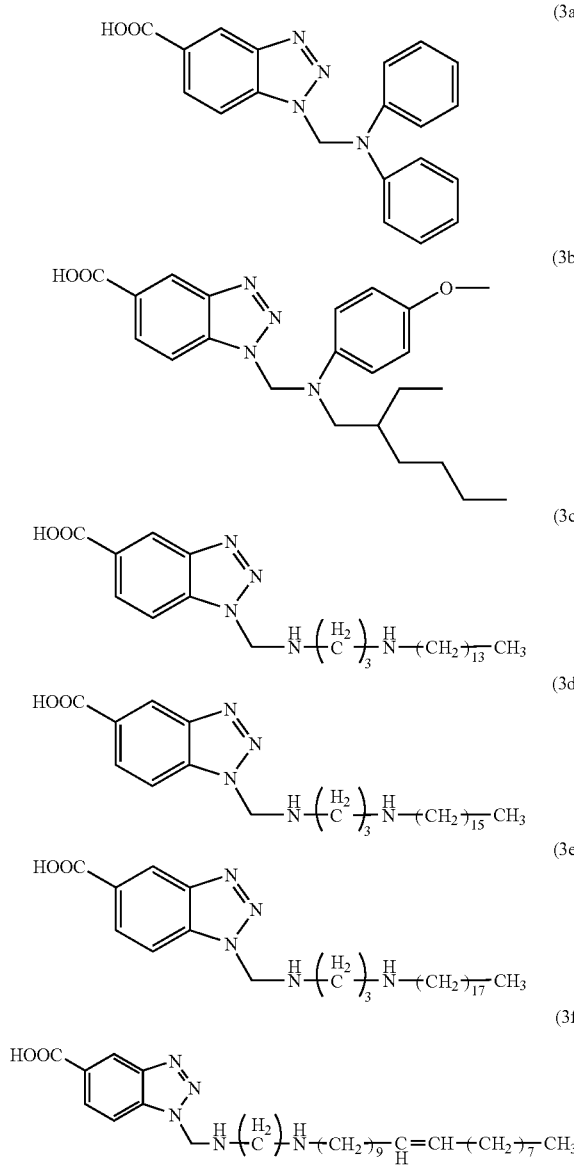

The content of the benzotriazole derivative represented by general formula (1) above in the photosensitive resin composition is preferably 0.001-2 parts by weight, more preferably 0.005-0.5 part by weight and even more preferably 0.01-0.3 part by weight, with respect to 100 parts by weight as the total of the components of the photosensitive resin composition without the organic solvent. If the content of the benzotriazole derivative is less than 0.001 part by weight, the resist made of the photosensitive resin composition will have insufficient adhesiveness for the conductive layer, tending to result in peeling of the resist during plating. If it exceeds 2 parts by weight, on the other hand, the sensitivity of the photosensitive resin composition will tend to be reduced, thus requiring extra energy for curing and leading to a reduced release property of the resist.

(Binder Polymer)

The binder polymer as component (A) has as its major function to impart film formability to the photosensitive resin composition. The binder polymer may be applied without any particular restrictions so long as it has such properties. As specific examples there may be mentioned acrylic-based resins, styrene-based resins, epoxy-based resins, amide-based resins, amide/epoxy-based resins, alkyd-based resins, phenol-based resins and the like. These may be used alone or in combinations of two or more. Preferred among these are polymers with properties allowing the obtained resist to be developed in aqueous alkali solutions. From this viewpoint, the binder polymer is preferably an acrylic-based resin.

These binder polymers may be obtained, for example, by radical polymerization of a polymerizable monomer. As examples of such polymerizable monomers there may be mentioned styrene, polymerizable styrene derivatives such as vinyltoluene, α-methylstyrene, p-methylstyrene and p-ethylstyrene, vinyl alcohol esters such as acrylamide, acrylonitrile and vinyl-n-butyl ether, (meth)acrylic acid esters, (meth)acrylic acid, α-bromo(meth)acrylic acid, α-chlor(meth)acrylic acid, β-furyl(meth)acrylic acid, β-styryl(meth)acrylic acid, maleic acid, maleic anhydride, maleic acid monoesters such as monomethyl maleate, monoethyl maleate and monoisopropyl maleate, and fumaric acid, cinnamic acid, α-cyanocinnamic acid, itaconic acid, crotonic acid, propiolic acid and the like. They may also be used alone or in combinations of two or more.

Throughout the present specification, "(meth)acrylic acid" refers to "acrylic acid" and its corresponding "methacrylic acid", while "(meth)acrylate" refers to "acrylate" and its corresponding "methacrylate".

As (meth)acrylic acid esters among the polymerizable monomers mentioned above there may be mentioned (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl(meth)acrylate, 2,2,3,3-tetrafluoropropyl(meth)acrylate, lauryl(meth)acrylate and 2-hydroxypropyl(meth)acrylate.

As examples of (meth)acrylic acid alkyl esters there may be mentioned methyl(meth)acrylate, ethyl(meth)acrylate, propyl(meth)acrylate, butyl(meth)acrylate, pentyl(meth)acrylate, hexyl(meth)acrylate, heptyl(meth)acrylate, octyl(meth)acrylate, 2-ethylhexyl(meth)acrylate and their structural isomers. These may be used alone or in combinations of two or more.

The binder polymer is preferably one containing a carboxyl group from the viewpoint of the alkali developing property. In this case, the carboxyl group content of the binder polymer is preferably 10-70 mol %. The binder polymer with a carboxyl group may be obtained, for example, by radical polymerization of a carboxyl group-containing polymerizable monomer with another polymerizable monomer. Methacrylic acid is particularly preferred as a carboxyl group-containing polymerizable monomer. From the viewpoint of pliability, the binder polymer is also preferably obtained by further adding styrene or a styrene derivative as a polymerizable monomer. From the same viewpoint, the binder polymer is most preferably a copolymer composed of acrylic acid or acrylic acid ester, and styrene or a styrene derivative.

When styrene or a styrene derivative is used as a copolymerizing component, the content of the styrene or styrene derivative is preferably 3-30 wt %, more preferably 4-28 wt % and most preferably 5-27 wt % in order to achieve satisfactory adhesiveness and release properties. If the content is less than 3 wt % the adhesiveness will tend to be inferior, and if it is greater than 30 wt % the release strip will be larger, tending to lengthen the release time.

The acid value of the binder polymer is preferably 30-200 mgKOH/g and more preferably 50-150 mgKOH/g. An acid value of less than 30 mgKOH/g will tend to lengthen the developing time, while a value of greater than 200 mgKOH/g will tend to reduce the developing solution resistance of the resist obtained by curing.

The weight-average molecular weight of the binder polymer (measured by gel permeation chromatography (GPC) and calculated from a calibration curve using standard polystyrene) is preferably 20,000-300,000, more preferably 20,000-200,000 and even more preferably 30,000-150,000. A weight-average molecular weight of less than 20,000 will tend to result in lower developing solution resistance, and greater than 300,000 will tend to lengthen the developing time.

Such binder polymers may be used alone or in combinations of two or more. As examples of binder polymers when two or more are used in combination, there may be mentioned two or more binder polymers composed of different copolymerizable components, two or more binder polymers with different weight-average molecular weights, and two or more binder polymers with different dispersibilities. There may also be used a polymer having a multimode molecular weight distribution, as described in Japanese Unexamined Patent Publication HEI No. 11-327137.

The content of the binder polymer in the photosensitive resin composition is preferably 20-80 parts by weight and more preferably 40-70 parts by weight with respect to 100 parts by weight as the total of the components of the photosensitive resin composition without the organic solvent. If the binder polymer content is less than 20 parts by weight, the obtained resist will be brittle and will have reduced durability during plating and the like. If it exceeds 80 parts by weight, on the other hand, the sensitivity of the photosensitive resin composition will tend to be reduced.

(Photopolymerizing Compound with Ethylenic Unsaturated Group)

The photopolymerizing compound having an ethylenic unsaturated bond as component (B) (hereinafter referred to as "photopolymerizing compound") is a component that is polymerized primarily by irradiation with active light rays for curing of the photosensitive resin composition. Such a photopolymerizing compound is a monomer or copolymer having a functional group which is crosslinkable by the action of light and/or the photopolymerization initiator described hereunder, and it is a compound with a copolymerizable ethylenic unsaturated bond in the molecule. There are no particular restrictions on its structure, and for example, the structure may be aliphatic, aromatic, alicyclic, heterocyclic or the like, and it may include an ester bond, urethane bond, amide bond or the like in the molecule. A (meth)acryloyl group is preferred for the ethylenic unsaturated bond. As specific examples of photopolymerizing compounds there may be mentioned compounds obtained by reacting α,β-unsaturated carboxylic acids with polyhydric alcohols, compounds obtained by reacting α,β-unsaturated carboxylic acids with bisphenol A-based meth)acrylate compounds and glycidyl group-containing compounds, urethane monomers such as (meth)acrylate compounds having urethane bonds in the molecule, nonylphenoxypolyethyleneoxy acrylate, phthalic acid-based compounds, (meth)acrylic acid alkyl esters, and the like. These may be used alone or in combinations of two or more. The photopolymerizing compound is most preferably a combination of a photopolymerizing unsaturated compound with one polymerizable ethylenic unsaturated bond in the molecule, and a photopolymerizing unsaturated compound with two or more polymerizable ethylenic unsaturated bonds in the molecule.

As examples of the aforementioned compounds obtained by reacting α,β-unsaturated carboxylic acids with polyhydric alcohols there may be mentioned polyethyleneglycol di(meth)acrylate having 2-14 ethylene groups, polypropyleneglycol di(meth)acrylate having 2-14 propylene groups, polyethylene/polypropyleneglycol di(meth)acrylate having 2-14 ethylene groups and 2-14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, tetramethylolmethane tri(meth)acrylate, tetramethylolmethane tetra (meth)acrylate, pentaerythritol di(meth)acrylate, pentaerythritol tri(meth)acrylate, dipentaerythritol penta(meth)acrylate, dipentaerythritol hexa(meth)acrylate, and the like. These may be used alone or in combinations of two or more. "EO" stands for ethylene oxide, and an EO-modified compound has a block structure of ethylene oxide groups. "PO" stands for propylene oxide, and a PO-modified compound has a block structure of propylene oxide groups.

As bisphenol A-based (meth)acrylate compounds there may be mentioned 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane and 2,2-bis(4-((meth)acryloxypolyethoxypolypropoxy)phenyl)propane. As examples of 2,2-bis(4-((meth)acryloxypolyethoxy)phenyl)propane compounds there may be mentioned 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane.

Among these, 2,2-bis(4-(methacryloxypentaethoxy)phenyl)propane is commercially available as BPE-500 (product of Shin-Nakamura Chemical Co., Ltd.), and 2,2-bis(4-(methacryloxypentadecaethoxy)phenyl)propane is commercially available as BPE-1300 (Shin-Nakamura Chemical Co., Ltd.). In the aforementioned 2,2-bis(4-((meth)acryloxypolyethoxy)phenyl)propane, the number of ethylene oxide groups per molecule is preferably 4-20 and more preferably 8-15. The aforementioned compounds may be applied as bisphenol A-based (meth)acrylate compounds either alone or in combinations of two or more.

As (meth)acrylate compounds having urethane bonds in the molecule there may be mentioned addition reaction products of (meth)acrylic monomer having an OH group at the β-position, with diisocyanate compounds (isophorone diisocyanate, 2,6-toluenediisocyanate, 2,4-toluenediisocyanate, 1,6-hexamethylenediisocyanate, etc.), as well as tris((meth) acryloxytetraethyleneglycol isocyanate)hexamethylene isocyanurate, EO-modified urethane di(meth)acrylate, EO,PO-modified urethane di(meth)acrylate, and the like. As an example of an EO-modified urethane di(meth)acrylate compound there may be mentioned UA-11 (product of Shin-Nakamura Chemical Co., Ltd.). As an example of an EO,PO-modified urethane di(meth)acrylate compound there may be mentioned UA-13 (product of Shin-Nakamura Chemical Co., Ltd.). These may be used alone or in combinations of two or more.

As examples of nonylphenoxypolyethyleneoxy acrylate compounds there may be mentioned nonylphenoxytetraethyleneoxy acrylate, nonylphenoxypentaethyleneoxy acrylate, nonylphenoxyhexaethyleneoxy acrylate, nonylphenoxyheptaethyleneoxy acrylate, nonylphenoxyoctaethyleneoxy acrylate, nonylphenoxynonaethyleneoxy acrylate, nonylphenoxydecaethyleneoxy acrylate, nonylphenoxyundecaethyleneoxy acrylate, and the like. These may also be used alone or in any desired combinations of two or more.

As phthalic acid-based compounds there may be mentioned γ-chloro-β-hydroxypropyl-β'-(meth)acryloyloxyethyl-o-phthalate, β-hydroxyalkyl-β'-(meth)acryloyloxyalkyl-o-phthalate, and the like. These may also be used alone or in any desired combinations of two or more.

The content of the photopolymerizing compound is preferably 10-70 parts by weight and more preferably 20-60 parts by weight with respect to 100 parts by weight as the total of the components of the photosensitive resin composition without the organic solvent. If the content of the photopolymerizing compound is less than 10 parts by weight, the sensitivity of the photosensitive resin composition may be reduced and the resist strength will tend to be insufficient. On the other hand, if it exceeds 70 parts by weight the resist layer will be too soft, tending to result in insufficient durability for plating or etching.

(Photopolymerization Initiator)

The photopolymerization initiator as component (C) is a component that initiates polymerization of the aforementioned photopolymerizing compound upon irradiation with active light rays. Any compound known as a photoinitiator in the prior art may be used as the photopolymerization initiator, without any restrictions. As specific examples there may be mentioned aromatic ketones such as benzophenone, 4-methylbenzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-(methylthio)phenyl]-2-morpholinopropanone-1 and the like; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone and the like; benzoinether compounds such as benzoinmethyl ether, benzoinethyl ether, benzoinphenyl ether and the like; benzoin compounds such as benzoin, methylbenzoin, ethylbenzoin and the like; benzyl derivatives such as benzyldimethylketal; 2,4,5-triarylimidazole dimers such as 2,2'-bis(o-chlorophenyl)-4,5,4',5'-tetraphenyl-1,2'-biimidazole, 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and the like; acridine derivatives such as 9-phenylacridine, 1,7-bis(9,9'-acridinyl)heptane and the like; N-phenylglycine, N-phenylglycine derivatives; coumarin-based compounds, thioxanthones, isoamyl benzoate, and the like. These may also be used alone or in any desired combinations of two or more.

The content of the photopolymerization initiator is preferably 0.05-10 parts by weight, more preferably 0.5-5 parts by weight and even more preferably 1-3.5 parts by weight with respect to 100 parts by weight as the total of the photosensitive resin composition without the solvent. If the photopolymerization initiator content is less than 0.05 part by weight, curing of the photosensitive resin composition will proceed insufficiently, tending to make it difficult to obtain a satisfactory resist. If it exceeds 10 parts by weight, on the other hand, the sensitivity of the photosensitive resin composition will be too high, possibly lowering the resolution.

(Other Components)

A preferred mode of the photosensitive resin composition also contains other components in addition to the aforementioned components A-D. One other component that may be mentioned is benzotriazole. Addition of benzotriazole in the photosensitive resin composition can further improve the resolution of the photosensitive resin composition, and the adhesiveness and plating resistance of the resist with respect to metal foils and the like.

It is also preferred to add benzothiazole or a derivative thereof in the photosensitive resin composition. As examples of benzothiazole derivatives there may be mentioned aminobenzothiazole and methylbenzothiazole. Addition of benzothiazole or a derivative thereof can also further improve the resolution of the photosensitive resin composition, and the adhesiveness and plating resistance of the resist with respect to metal foils and the like. Particularly, a combination of benzotriazole and benzothiazole can significantly reduce coloration of the metal foil in the conductive layer, while maintaining excellent adhesiveness and resolution.

The content of benzotriazole or benzothiazole or a mixture thereof in the photosensitive resin composition is preferably about 0.01-2 parts by weight with respect to 100 parts by weight as the total of components A-D. A content in this range will result in particularly satisfactory resolution, adhesiveness and coloration resistance of the conductive layer, etc.

As other additional components there may be mentioned organic halides. As organic halides there may be mentioned pentabromoethane, tribromoacetophenone, bis-(tribromomethyl)sulfone, tribromomethylphenylsulfone and the like. Addition of such organic halides will tend to further improve the sensitivity of the photosensitive resin composition.

The photosensitive resin composition may, if necessary, also contain dyes such as malachite green, coloring agents such as tribromophenylsulfone, leuco crystal violet or the like, thermal coloring inhibitors, plasticizers such as p-toluenesulfonamide, pigments, fillers, defoaming agents, flame retardants, stabilizers, tackifiers, leveling agents, release accelerators, antioxidants, aromatics, imaging agents, thermal crosslinking agents and the like. Their contents may be about 0.01-20 parts by weight each with respect to 100 parts by weight as the total of components A-D. They may also be added alone or in combinations of two or more.

The photosensitive resin composition may also contain a filler in a range that does not lower the resolution or flame resistance. As fillers there may be mentioned inorganic fine particles such as silica, fused silica, talc, alumina, hydrated alumina, barium sulfate, aluminum hydroxide, magnesium hydroxide, calcium hydroxide, Aerosil and calcium carbonate, organic fine particles such as powdered epoxy resin, powdery polyimide particles and the like, and powdery Teflon™ particles. Such fillers may be subjected to coupling treatment beforehand. They may be dispersed in the photosensitive resin composition by a known kneading method employing a kneader, ball mill, bead mill, triple roll or the like. The content of such fillers may be about 2-20 wt % and preferably about 5-15 wt % with respect to the total solid weight of the photosensitive resin composition.

(Photosensitive Film)

A photosensitive film according to a preferred mode will now be explained. FIG. 1 is a schematic cross-sectional view showing an embodiment of a photosensitive film. As shown here, the photosensitive film 1 comprises a support 11, a resin layer 12 made of a photosensitive resin composition according to the aforementioned mode formed on the support, and a protective film 13 formed on the resin layer 12.

The support 11 may be a polymer film having heat resistance and solvent resistance, such as polyethylene terephthalate, polypropylene, polyethylene or polyester, for example. The thickness of the support 11 in the photosensitive film 1 is preferably 5-150 µm, more preferably 5-25 µm, even more preferably 8-20 µm and yet more preferably 10-16 µm. A thickness of less than 5 µm will tend to lead to tearing of the support 11 when the support 11 is released prior to developing. A thickness of greater than 150 µm, on the other hand, will tend to reduce the resolution of the resin layer 12. The haze of the support 11 is preferably 0.001-5.0, more preferably 0.001-2.0 and even more preferably 0.01-1.8. A haze of greater than 2.0 will also tend to reduce the resolution of the resin layer 12. The haze may be measured according to JIS K 7105, and for example, it may be measured using a commercially available turbidimeter such as an NDH-1001DP (trade name of Nippon Denshoku Industries Co., Ltd.).

The resin layer 12 is composed of a photosensitive resin composition according to the mode described above, and its thickness is preferably 1-150 µm, more preferably 1-100 µm and even more preferably 1-50 µm. Industrial coating of the resin layer 12 is difficult, hampering efforts to produce a thickness of less than 1 µm. On the other hand, if the resin layer 12 is thicker than 100 µm, the adhesiveness and resolution may be reduced.

The method of forming the resin layer 12 on the support 11 may be, for example, a method of mixing the photosensitive resin composition of this mode with a prescribed solvent or the like to form a solution or varnish, and coating it onto the support 11 and then removing the solvent or the like. The solvent mixed with the photosensitive resin composition may be methanol, ethanol, isopropyl alcohol, acetone, methyl ethyl ketone, methylcellosolve, ethylcellosolve, toluene, N,N-dimethylformamide, methyleneglycol monomethyl ether, propyleneglycol monomethyl ether, methylene chloride or the like, any of which may be used alone or in combinations. The solution or varnish preferably has a solid content of about 30-60 wt % based on the total weight.

The method of coating the solution or varnish on the support 11 may be a publicly known method using, for example, a roll coater, comma coater, gravure coater, air knife coater, die coater, bar coater or the like. The solvent or varnish may be removed by heating the laminate after coating of the solution, at a temperature of, for example, 70-150° C. for about 5-30 minutes. The amount of solvent residue in the resin layer 12 after removal of the solvent is preferably no greater than 2 wt % from the standpoint of preventing solvent dispersal in subsequent steps.

The protective film 13 may be a polymer film having heat resistance and solvent resistance, such as polyethylene terephthalate, polypropylene, polyethylene or polyester, for example. When the photosensitive film 1 is used to form a resin layer on a printed circuit board as described hereunder, the protective film 13 preferably has lower adhesiveness for the resin layer 12 than the support 11, from the standpoint of facilitating release of the protective layer 13. The protective film 13 is preferably made of a polyolefin film such as polyethylene or polypropylene.

The thickness of the protective film 13 is preferably 5-30 µm, more preferably 10-28 µm and even more preferably 15-25 µm. A thickness of less than 5 µm will tend to result in tearing of the film 6 when performing lamination on a copper-clad laminate or the like. On the other hand, a thickness of greater than 30 µm will tend to excessively increase the production cost of the photosensitive film 2.

The method of laminating the protective film 13 on the resin layer 12 may be, for example, a method of coating and drying a solution or the like containing the photosensitive resin composition on the support 11, and then laminating the protective film 13 onto the dried resin layer 12 and heating them for contact bonding.

A photosensitive film 1 having such a construction can be stored either in a sheet form or in a roll form wound around a winding core or the like. When the film is stored in a wound roll form, an edge separator is preferably situated at the edge of the roll from the viewpoint of edge protection, while from the viewpoint of preventing edge fusion, the edge separator is preferably moisture-proof. When the film is packaged, a black sheet with low moisture permeability is preferred for bundling.

A photosensitive film 1 according to the preferred mode has the construction described above, but it may also comprise, in addition to the support 11, resin layer 12 and protective film 13, also interlayers or protective layers such as a cushion layer, adhesive layer, photoabsorbing layer, gas barrier layer or the like. Also, the protective film 13 is not essential, and a basic bilayer structure consisting of the support 11 and resin layer 12 may instead be used.

(Resist Pattern Forming Method)

A method of forming a resist pattern using the photosensitive resin composition or photosensitive film according to the aforementioned mode will now be explained. A resist pattern can be suitably formed, for example, by a method comprising a resin layer forming step in which a resin layer made of a photosensitive resin composition according to the aforementioned mode is formed on a board, an exposure step in which prescribed areas of the resin layer are irradiated with active light rays to form exposed areas, and a removal step in which the areas other than the exposed areas of the resin layer are removed.

In this method, a board is first prepared for formation of the resist pattern. The board may be an insulating board made of a resin material or the like, or a conductive layer-attached board where a conductive layer is formed on one or both sides of an insulating board. The material of the conductive layer in a conductive layer-attached board may be, for example, a metal such as copper, copper-based alloy, nickel, chromium, iron, iron-based alloy such as stainless steel or the like, among which copper, copper-based alloys and iron-based alloys are preferred.

A resin layer made of a photosensitive resin composition according to the mode described above is then formed on the surface of the board. The method of forming the resin layer may be, for example, a method of coating the aforementioned solution or varnish containing the photosensitive resin composition onto the board by a known coating method and then removing the solvent from the coated solution or varnish, or a method of using the aforementioned photosensitive film 1. The thickness of the resin layer formed on the board will usually be in the range of 10-150 μm. The obtained resin layer is composed primarily of the components of the solution or varnish after removal of most of the solvent.

When the photosensitive film 1 is used to form the resin layer, the protective film 13 is first released from the photosensitive film 1 and the photosensitive film 1 is laminated on the board with the resin layer 12 contacting it, after which a hot roll laminator or the like is used for contact bonding. The contact bonding conditions are preferably a temperature of about 70-130° C. and a pressure of about 0.1-1 MPa (about 1-10 kgf/cm$^2$), and from the viewpoint of adhesiveness and follow-up property, the contact bonding is preferably carried out under reduced pressure. The board may be preheated, from the standpoint of improving the adhesiveness of the resin layer 12 for the board.

For formation of the resist pattern, prescribed sections of the resin layer are irradiated with active light rays for photocuring after the resin layer has been formed on the board (exposure step). The exposure method may be, for example, a method of irradiation with active light rays in an image form, through a negative or positive mask known as artwork. When the support 11 of the photosensitive film 1 is on the resin layer, the exposure may be carried out after release and removal of the support 11, but the exposure may be carried out through the support 11 if it is transparent. A mask may be placed in direct contact with the resin layer, or it may be placed in contact via a transparent film.

The light source for the active light rays used for exposure may be a publicly known light source such as, for example, a carbon arc lamp, mercury vapor arc lamp, ultra-high pressure mercury lamp, high pressure mercury lamp, xenon lamp or the like, which efficiently emits ultraviolet rays, or a photoflood lamp, solar lamp or the like which efficiently emits visible light.

When the support 11 from the photosensitive film 1 is present on the resin layer after exposure, the support 11 is removed before development for removal of the unexposed sections, such as wet development with a developing solution such as an aqueous alkali solution, aqueous developing solution or organic solvent, or dry development, to form a resist pattern.

As examples of aqueous alkali solutions to be used for development there may be mentioned a 0.1-5 wt % sodium carbonate dilute solution, a 0.1-5 wt % potassium carbonate dilute solution or a 0.1-5 wt % sodium hydroxide dilute solution. The pH of the aqueous alkali solution is preferably in the range of 9-11, and the temperature is adjusted as appropriate for the developing property of the photosensitive resin composition layer. The aqueous alkali solution may also contain added surfactants, defoaming agents, organic solvents and the like.

The developing system may be, for example, a dip system, a spray system, or brushing, slapping or the like. As post-development treatment, heating may be carried out at about 60-250° C. or exposure at about 0.2-10 J/cm$^2$, as necessary. This can further harden the resist pattern, and further improve the durability in the subsequent steps such as plating.

(Printed Circuit Board Manufacturing Process)

A process for manufacturing a printed circuit board using a board with a resist pattern formed thereon by the aforementioned method will now be explained. The printed circuit board manufacturing process may be, for example, a process in which the necessary conductive portions are formed by plating (additive process), or a process in which the unwanted portions of the conductive layer formed on the board are removed by etching (subtractive process).

An additive process employs, for example, a board having no conductive layer formed on the surface (such as the insulating board mentioned above), and after plating the board on which the resist pattern has been formed in the manner described above, the resist pattern is removed. In this process, the resist pattern formed on the board is used as a plating resist. Plating can form a circuit pattern in the desired shape on the sections of the board that are not covered with the resist pattern.

The plating process may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating.

A subtractive process employs, for example, a conductive layer-attached board such as explained for the method of forming the resist pattern, and it may be (1) a method in which a conductive layer-attached board on which the resist pattern has been formed by a method according to the mode described above is subjected to etching, and then the resist pattern is removed, or (2) a method in which a conductive layer-attached board on which the resist pattern has been formed is plated and then the resist pattern is removed, after which the non-plated sections on the conductive layer are etched.

In the process of (1), the resist pattern functions as an etching resist. By etching to remove the sections of the conductive layer on which no etching resist has been formed, there is formed a circuit pattern with the prescribed shape on the board.

In the process of (2), on the other hand, the resist pattern first functions as a plating resist, whereby the plating layer is formed only on the sections of the conductive layer which are not covered by the plating resist. Then, after removing the resist pattern, the plating layer functions as an etching resist whereupon etching removes only the sections of the conductive layer on which the plating layer is not formed, to form a circuit pattern having the prescribed shape. This manner of plating can be accomplished by the same process as for the additive process described above.

In these processes, the etching may be carried out using a publicly known etching solution, with the conductive layer being removed by dissolution in the etching solution. The etching solution may be, for example, a copper(II) chloride solution, ferric chloride solution, alkali etching solution or hydrogen peroxide-based etching solution, but a ferric chloride solution is particularly preferred from the viewpoint of a satisfactory etch factor. In the process of (2), the etching solution is preferably one selected so as to have a solubility allowing selective removal of only the sections other than the plating layer.

Removal of the resist pattern in these processes can be accomplished, for example, by using for release of the resist pattern an aqueous solution that is more strongly alkaline than the aqueous alkali solution used for development during formation of the resist pattern. The strongly alkaline aqueous solution may be, for example, a 1-10 wt % sodium hydroxide aqueous solution or a 1-10 wt % potassium hydroxide aqueous solution. The releasing system may be, for example, a dipping system, spraying system or the like, and such methods may be used alone or in combination.

The resist for plating or etching in the printed circuit board manufacturing process described above consists of the resist pattern formed using a photosensitive resin composition according to the mode described above. As mentioned above, such a resist pattern has high resolution and highly superior adhesiveness for conductive layers made of metals and the like, while producing very little discoloration of conductive layers even in the case of plating or other treatment. Thus, such a manufacturing process can easily produce a printed circuit board having a circuit pattern with a fine pattern, with satisfactory line edge forms and with very low surface coloration.

EXAMPLES

The present invention will now be explained in greater detail by examples, with the understanding that the invention is in no way limited to these examples.

[Production of Photosensitive Resin Composition]

Examples 1-6, and Comparative Examples 1-3

First, a binder polymer was synthesized in the following manner. Specifically, 500 g of a mixed solvent comprising methylcellosolve and toluene in a weight ratio of 3:2 was added to a flask equipped with a stirrer, reflux condenser, thermometer, dropping funnel and nitrogen gas inlet tube, and the mixture was stirred while blowing in nitrogen gas and heated to 80° C.

Separately, there was prepared a solution comprising a mixture of 100 g of methacrylic acid, 200 g of ethyl methacrylate, 100 g of ethyl acrylate, 100 g of styrene and 0.8 g of azobisisobutyronitrile as copolymerizing monomers (hereinafter referred to as "solution (a)"), and solution (a) was added dropwise over a period of 4 hours to the same mixed solvent mentioned above heated to 80° C., after which the mixture was warmed for 2 hours while stirring at 80° C.

Also, a solution of 1.2 g of azobisisobutyronitrile in 100 g of the same mixed solvent as above was added dropwise to the flask over a period of 10 minutes. The dropped solution was warmed at 80° C. for 3 hours while stirring, and then heated to 90° C. over a period of 30 minutes. The solution was warmed at 90° C. for 2 hours, and then cooled to obtain a binder polymer solution. Acetone was added to the obtained solution for adjustment to a nonvolatile (solid) content of 45 wt %.

The weight-average molecular weight of the obtained binder polymer was 80,000. The weight-average molecular weight was measured by gel permeation chromatography (GPC), with calculation based on a standard polystyrene calibration curve. The GPC conditions were as follows.

Pump: Hitachi L-6000 (Hitachi, Ltd.)
Column: Gelpack GL-R420+Gelpack GL-R430+Gelpack GL-R440 (total: 3) (all trade names of Hitachi Chemical Co., Ltd.).
Eluant: Tetrahydrofuran
Measuring temperature: 25° C.
Flow rate: 2.05 mL/min
Detector: Hitachi L-3300 RI (Hitachi, Ltd.)

Next, the obtained binder polymer solution was mixed with each of the components listed in Table 1 in the specified amounts (g) to prepare photosensitive resin compositions for Examples 1-6 and Comparative Examples 1-3.

TABLE 1

| | Component | Example 1 | Example 2 | Example 3 | Example 4 | Example 5 | Example 6 | Comp. Ex. 1 | Comp. Ex. 2 | Comp. Ex. 3 |
|---|---|---|---|---|---|---|---|---|---|---|
| Binder polymer solution | | 134 | 134 | 134 | 134 | 134 | 134 | 134 | 134 | 134 |
| Photopolymerizing compound | Bisphenol A methacrylate EO (10 mole) | 30.0 | 30.0 | 30.0 | 30.0 | 30.0 | 30.0 | 30.0 | 30.0 | 30.0 |
| | #400 polypropyleneglycol diacrylate | 10.0 | 10.0 | 10.0 | 10.0 | 10.0 | 10.0 | 10.0 | 10.0 | 10.0 |
| Photopolymerization initiator | Benzophenone | 5.0 | 5.0 | 5.0 | 5.0 | — | — | 5.0 | 5.0 | 5.0 |
| | 2-(o-chlorophenyl)-4,5-diphenylimidazole dimer | — | — | — | — | 3.0 | 3.0 | — | — | — |
| | N,N'-tetraethyl-4,4'-diaminobenzophenone | 0.2 | 0.2 | 0.2 | 0.2 | 0.2 | 0.2 | 0.2 | 0.2 | 0.2 |
| Coloring agent | Leuco crystal violet | 1.0 | 1.0 | 1.0 | 1.0 | 1.0 | 1.0 | 1.0 | 1.0 | 1.0 |
| | Tribromomethylphenyl sulfone | 1.0 | 1.0 | 1.0 | 1.0 | 1.0 | 1.0 | 1.0 | 1.0 | 1.0 |
| Benzotriazole | | 0.05 | 0.05 | 0.05 | 0.05 | 0.05 | — | 0.05 | — | 0.05 |
| Benzotriazole derivative | Benzotriazole derivative A | 0.20 | — | — | — | — | — | — | — | — |
| | Benzotriazole derivative B | — | 0.20 | — | — | — | — | — | — | — |
| | Benzotriazole derivative C | — | — | 0.20 | — | — | 0.05 | — | — | — |
| | Benzotriazole derivative D | — | — | — | 0.20 | — | 0.05 | — | — | — |
| | Benzotriazole derivative E | — | — | — | — | — | 0.05 | — | — | — |
| | Benzotriazole derivative F | — | — | — | — | 0.1 | 0.1 | — | — | — |
| | Benzotriazole derivative G | — | — | — | — | — | — | — | — | 0.20 |
| Dye | Malachite green | 0.05 | 0.05 | 0.05 | 0.05 | 0.05 | 0.05 | 0.05 | 0.05 | 0.05 |

In the table, the bisphenol A methacrylate EO is 2,2-bis(4-(methacryloxypentaethoxy)phenyl)propane (FA-321M, trade name of Hitachi Chemical Co., Ltd.), and the #400 polypropylene glycol diacrylate is heptapropyleneglycol diacrylate (APG400, trade name of Shin-Nakamura Chemical Co., Ltd.).

Also, benzotriazole derivative A is 1-(N,N-diphenyl)aminomethylbenzotriazole-5-carboxylic acid (compound represented by general formula (3a) above), benzotriazole derivative B is 1-[N-(2-ethylhexyl)-N-(4-methoxyphenyl)] aminomethylbenzotriazole-5-carboxylic acid (compound represented by general formula (3b) above), benzotriazole derivative C is 1-[(3-tetradecylamino-propylamino)-methyl]-1H-benzotriazole-5-carboxylic acid (compound represented by general formula (3c) above), benzotriazole derivative D is 1-[(3-hexadecylamino-propylamino)-methyl]-1H-benzotriazole-5-carboxylic acid (compound represented by general formula (3d) above), benzotriazole derivative E is 1-[(3-octadecylamino-propylamino)-methyl]-1H-benzotriazole-5-carboxylic acid (compound represented by general formula (3e) above), benzotriazole derivative F is 1-[(3-octadec-enyl-amino-propylamino)-methyl]-1H-benzotriazole-5-carboxylic acid (compound represented by general formula (3f) above), and benzotriazole derivative G is bis(N,N-2-ethylhexyl)aminomethylene-5-carboxy-1,2,3-benzotriazole (product of Chiyoda Chemical Co., Ltd.).

[Evaluation of Resist Properties]

(Fabrication of Photosensitive Film)

The photosensitive resin compositions of Examples 1-6 and Comparative Examples 1-3 were each coated onto an 18 μm-thick polyethylene terephthalate (PET) film (HTR-02, trade name of Teijin-DuPont Films) using a comma coater. The coating was then dried to form a 40 μm-thick resin layer. A 22 μm-thick polyethylene film (NF-13, trade name of Tamapoly Co., Ltd.) was attached onto the resin layer as a protective film, to obtain different photosensitive films provided with resin layers made of the photosensitive resin compositions of Examples 1-6 and Comparative Examples 1-3.

(Cross-Cut Test)

First, a copper-clad laminate bearing a copper foil on both sides of a board (MCL E-67, trade name of Hitachi Chemical Co., Ltd.) was prepared, and the copper foil surfaces were polished with a buffing machine and rinsed with water. After then releasing the protective film of each photosensitive film, it was stacked on one copper foil surface of the copper-clad laminate with the resin layer in contact therewith, and a dry film laminator (A60, product of Hitachi Chemical Co., Ltd.) was used for thermocompression bonding at 110° C. This yielded different laminated bodies each having a construction with a resin layer and PET film in that order on a copper-clad laminate. Active light rays were irradiated from the PET film side of each obtained laminated body for exposure, to cure the resin layer and form a resist. The light source for the active light rays was a 5 kW high pressure mercury lamp (HMW-201 GX, product of Orc Manufacturing Co., Ltd.).

The exposed laminated body was used for a cross-cut test as explained below, to evaluate the adhesiveness of the resist for the copper foil in each laminated body. Specifically, first the PET film was released from the laminated body. Next, a cutter guide was used to cut notches in a tessellated fashion at the center of the surface-exposed resin layer, in such a manner that 11 parallel lines are drawn in both orthogonal directions at a spacing distance of 1 mm in order to form 100 squares in a square area of 1 cm². and the cut region was evaluated. The cut notches were produced by pulling the blade tip of the cutter knife at a constant speed for 0.5 sec for each cut, while maintaining it at a fixed angle in a range of 35-45° with respect to the photosensitive film, and penetrating the resist layer to reach to the circuit-forming board. If a resist has more squares cleanly attached to the copper foil, its adhesiveness is superior. The results are shown in Table 2. Table 2 shows the results of evaluating each laminated body after the cross-cut test, based on a 3-level scale of A, B and C according to the evaluation scale described below.

Evaluation Scale

A: Slight peeling at the notch intersections, but no peeling of individual squares, and a loss area of less than 5% of the total area of squares.

B: Peeling on both sides and intersections of notches, and a loss area of 5-35% of the total area of squares.

C: Greater peeling width of notches than in level B above, and a loss area of greater than 35% of the total area of squares.

(Resist Pattern Formation)

Laminated bodies prior to exposure, obtained in the same manner as for the "cross-cut test" described above, were irradiated with active light rays from the PET film through a negative mask with a prescribed pattern, for exposure of the resin layers. The light source for the active light rays was a 5 kW high pressure mercury lamp (HMW-201GX, product of Orc Manufacturing Co., Ltd.). After removing the PET film from each exposed laminated body, development was performed by spraying the resin layer with a 1% sodium carbonate aqueous solution for 30 seconds (spray pressure: 0.2 MPa), to form a resist pattern.

(Evaluation of Resist Pattern Bubbles)

Each laminated body having the resist pattern formed therein was used for observation of the resist pattern edges by scanning electron microscope (SEM), to determine whether or not bubbles had been produced in the resist pattern. A resist pattern with fewer bubbles indicates superior adhesiveness. The results are shown in Table 2. Table 2 shows the results of evaluating the presence and severity of bubbles at the edges of the resist patterns, based on a 3-level scale of A, B and C according to the scale described below.

Evaluation Scale

A: No bubbles at resist pattern edges.

B: Bubbles produced at resist pattern edges, with a distance of less than 5 μm between the edge and copper foil.

C: Bubbles produced at resist pattern edges, with a distance of at least 5 μm between the edge and copper foil.

(Evaluation of Resist Pattern Formation)

The form of the resist pattern in each laminated body having a resist pattern formed thereon was obtained with a scanning electron microscope (SEM), and the width at the top part of the resist pattern ($W_1$) was compared with the width at the section of the resist pattern adhering to the copper foil ($W_2$), in order to evaluate the presence and severity of resist pattern "skirt trailing" (a phenomenon wherein $W_2$ is greater than $W_1$). A resist pattern with less "skirt trailing" results in less peeling during plating and exhibits more excellent adhesiveness. The obtained results are shown in Table 2. Table 2 shows the results of evaluating the severity of "skirt trailing", based on a 3-level scale of A, B and C according to the evaluation scale described below.

Evaluation Scale

A: Almost no skirt trailing.

B: Value of $(W_2/W_1) \times 100$ greater than 100 and no greater than 110.

C: value of $(W_2/W_1) \times 100$ greater than 110.

(Circuit Pattern Formation)

Each resist pattern-formed laminated body was immersed for 60 seconds in an acidic degreasing agent aqueous solution at 40° C. and spray washed, subsequently immersed for 60 seconds in an approximately 1% ammonium persulfate aqueous solution and spray washed, and then immersed for 60 seconds in an approximately 15% sulfuric acid aqueous solution. Next, the laminated body was placed in a copper sulfate plating bath (75 g/L copper sulfate, 190 g/L sulfuric acid, 50 ppm chloride ion, 25° C. temperature) and subjected to copper plating for 60 minutes at 2.0 A/dm².

After completion of the copper plating, the laminated body was immediately washed with water, immersed in an approximately 15% hydrogen borofluoride aqueous solution, and subsequently placed in a solder plating bath (22 mL/L 45% zinc borofluoride, 200 mL/L 42% hydrogen borofluoride, 25° C. temperature) for solder plating for 20 minutes at 1.5 A/dm², and then washed with water. After removing the resist pattern from the plated laminated body, the copper foil on the non-plated regions was removed by etching to obtain a laminated sheet with a circuit pattern formed thereon.

(Evaluation of Copper Foil Discoloration)

The circuit pattern on the circuit pattern-formed laminated body was observed to evaluate whether any discoloration had been produced on the copper foil. The obtained results are shown in Table 2. Table 2 shows the results of evaluating the copper foil discoloration, based on a 3-level scale of A, B and C according to the evaluation scale described below.

Evaluation Scale
A: No discoloration.
B: Faint reddish brown color.
C: Reddish brown color.

TABLE 2

| Property evaluation | | Example 1 | Example 2 | Example 3 | Example 4 | Example 5 | Example 6 | Comp. Ex. 1 | Comp. Ex. 2 | Comp. Ex. 3 |
|---|---|---|---|---|---|---|---|---|---|---|
| Adhesiveness evaluation | Crosscut test | A | A | A | A | A | A | A | C | B |
| | Resist pattern bubbles | B | B | B | B | B | B | B | C | C |
| | Resist pattern form | A | B | B | B | A | A | B | C | B |
| Copper foil discoloration | | A | A | A | A | A | A | C | A | B |

Table 2 shows that when the photosensitive resin compositions of Examples 1-6 were used, it was possible to form a resist pattern with excellent adhesiveness for the copper foils and the superior plating resistance, as well as low copper foil discoloration. In contrast, when using the photosensitive resin compositions of Comparative Examples 1-3, the formed resist patterns had insufficient adhesiveness for the copper foils and readily produced copper foil discoloration.

The invention claimed is:

1. A photosensitive resin composition comprising;
   a binder polymer,
   a photopolymerizing compound with an ethylenic unsaturated group,
   a photopolymerization initiator, and
   a benzotriazole derivative represented by the following general formula (1):

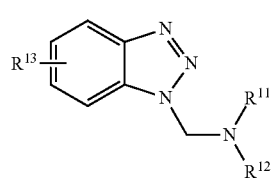

[wherein $R^{11}$ and $R^{12}$ each independently represent hydrogen or a monovalent organic group, and $R^{13}$ represents a halogen atom, an alkyl, cycloalkyl, allyl, aryl, amino, alkylamino, nitro, cyano, mercapto, alkylmercapto, hydroxyl, hydroxyalkyl, carboxyl, carboxyalkyl, acyl or alkoxy group or a monovalent group with a heterocyclic ring, with the proviso that at least one of $R^{11}$ and $R^{12}$ is an organic group containing an imino group and a C10 or greater hydrocarbon group].

2. A photosensitive resin composition according to claim 1, characterized in that $R^{13}$ is a carboxyl group.

3. A photosensitive resin composition according to claim 1, characterized by further comprising benzothiazole and/or a derivative thereof.

4. A photosensitive film comprising;
   a support, and
   a resin layer composed of a photosensitive resin composition according to claim 3, formed on the support.

5. A photosensitive film comprising;
   a support, and
   a resin layer composed of a photosensitive resin composition according to claim 1, formed on the support.

6. A photosensitive resin composition comprising;
   a binder polymer,
   a photopolymerizing compound with an ethylenic unsaturated group,
   a photopolymerization initiator, and
   a benzotriazole derivative represented by the following general formula (1):

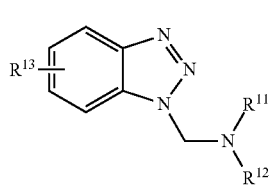

[wherein $R^{11}$ and $R^{12}$ each independently represent hydrogen or a monovalent organic group, and $R^{13}$ represents a halogen atom, an alkyl, cycloalkyl, allyl, aryl, amino, alkylamino, nitro, cyano, mercapto, alkylmercapto, hydroxyl, hydroxyalkyl, carboxyl, carboxyalkyl, acyl or alkoxy group or a monovalent group with a heterocyclic ring, with the proviso that at least one of $R^{11}$ and $R^{12}$ is a group represented by the following general formula (2):

[wherein $R^{21}$ represents C1-5 alkylene and $R^{22}$ represents a C10-30 monovalent hydrocarbon group]].

7. A photosensitive resin composition according to claim 6, characterized in that $R^{13}$ is a carboxyl group.

8. A photosensitive resin composition according to claim 6, characterized by further comprising benzothiazole and/or a derivative thereof.

9. A photosensitive film comprising;
a support, and
a resin layer composed of a photosensitive resin composition according to claim 6, formed on the support.

10. A photosensitive resin composition comprising;
a binder polymer,
a photopolymerizing compound with an ethylenic unsaturated group,
a photopolymerization initiator, and
a benzotriazole derivative represented by the following general formula (1):

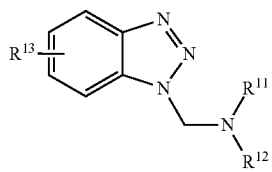
(1)

[wherein $R^{11}$ and $R^{12}$ each independently represent hydrogen or a monovalent organic group, and $R^{13}$ represents a halogen atom, an alkyl, cycloalkyl, allyl, aryl, amino, alkylamino, nitro, cyano, mercapto, alkylmercapto, hydroxyl, hydroxyalkyl, carboxyl, carboxyalkyl, acyl or alkoxy group or a monovalent group with a heterocyclic ring, with the proviso that at least one of $R^{11}$ and $R^{12}$ is an optionally substituted aryl group or an organic group containing a C10 or greater hydrocarbon group], characterized by further comprising benzotriazole.

11. A photosensitive resin composition according to claim 10, characterized in that $R^{13}$ is a carboxyl group.

12. A photosensitive resin composition according to claim 10, characterized by further comprising benzothiazole and/or a derivative thereof.

13. A photosensitive film comprising;
a support, and
a resin layer composed of a photosensitive resin composition according to claim 10, formed on the support.

* * * * *